United States Patent [19]

Fox

[11] Patent Number: 4,891,536

[45] Date of Patent: Jan. 2, 1990

[54] SOLID STATE SWITCH

[75] Inventor: Ernest I. Fox, Sudbury, Mass.

[73] Assignee: Raytheon Company, Lexington, Mass.

[21] Appl. No.: 290,221

[22] Filed: Dec. 27, 1988

[51] Int. Cl.[4] .......................... H03K 5/00; H03K 3/30; H03H 7/01

[52] U.S. Cl. ..................................... 307/521; 307/282; 328/167; 328/138; 330/165; 330/176; 333/177

[58] Field of Search ....................... 307/520, 521, 282; 328/138, 167, 165; 333/177, 178, 180; 330/165, 176

[56] References Cited

U.S. PATENT DOCUMENTS 4,068,135  1/1978  Sonobe et al. ....................... 307/282

Primary Examiner—Stanley D. Miller
Assistant Examiner—Timothy P. Callahan
Attorney, Agent, or Firm—Philip J. McFarland; Richard M. Sharkansky

[57] ABSTRACT

An electronic switching arrangement is shown to consist of an effective balanced pi configuration using series and shunt FETs and transformer coupling so that the impedances seen by such FETs are optimized.

4 Claims, 2 Drawing Sheets

SOLID STATE SWITCH

This invention was made with Government support under Contract No. DAAH01-86-C-A018 awarded by the Department of the Army. The Government has certain rights in this invention.

BACKGROUND OF THE INVENTION

This invention pertains generally to switching arrangements, and particularly to switching arrangements using transistors as switching elements.

It is well known in the art that so-called electronic switches (or gates) are useful in many applications wherein high frequency signals are to be switched (or gated). For convenience, reference will hereinafter be made only to switches, it being deemed obvious that electronic gates are simply a species of an electronic switch. In such switches, solid state devices, as diodes or transistors, are caused to change from an "ON" condition to an "OFF" condition to pass or to inhibit high frequency signals. To be of any great use in many applications for high frequency signals an electronic switch must exhibit: (1) a high degree of isolation (meaning that the impedance of the solid state devices must be high in the "OFF" condition and low in the "ON" condition); (2) low switching transients (meaning minimal leakage of gating signals into the radio frequency signal path); (3) an appropriate bandwidth (meaning that the frequency of any signal applied to the electronic switch may be changed within reasonable limits); (4) inherent balance (meaning that parameters of the solid state devices need not be closely matched); and (5) independence from complex control circuitry (meaning that the physical size of the electronic switch is kept as small as practicable).

Unfortunately, known electronic switches such as the so-called "balanced pi" configuration cannot simultaneously meet all of the requirements just listed. In particular, if isolation is increased, bandwidth is decreased. High terminating impedances produce adequate isolation with narrow bandwidth; conversely, low terminating impedances produce poor isolation with relatively wide bandwidth.

In many applications, spurious signals generated when the state of a balanced pi switching arrangement is changed, i.e. switching transients, detract substantially from the value of such an arrangement. Thus, even though an intrinsically high degree of symmetry of elements exists in the balanced pi switching arrangement to permit common mode rejection of some switching transients, the bandwidth of any practical balanced pi switching arrangement with low switching transients must be extremely narrow if high isolation and relatively wide bandwidth are both required. An arrangement different from the balanced pi switching arrangement is usually used. For example, diode gates are known. However, such gates require diodes with parameters that are closely matched. Such a requirement means that diodes must be screened before assembly and used in sets.

SUMMARY OF THE INVENTION

With the foregoing background of the invention in mind, it is a primary object of this invention to provide a balanced pi switching arrangement that exhibits all of the characteristics desired for switching high frequency signals.

Another object of this invention is to provide a balanced pi switching arrangement that utilizes only standard known solid state devices that need not have any critical parameters.

Its unique property lies in its ability to realize the unusually low switching transients of the balanced pi while exhibiting fewer of the bandwidth/isolation compromises that limit the usefulness of the standard balanced pi. This is the result of the unusual transformer/device configuration which enables different impedance levels to be utilized for the series and shunt gating elements. The result is a significant improvement in switching isolation and bandwidth while retaining the inherently low switching transient properties of the basic circuit, thereby making the circuit useful in a wider variety of applications.

BRIEF DESCRIPTION OF THE DRAWINGS

For a more complete understanding of this invention reference is now made to the following description of the accompanying drawings in which.

DESCRIPTION OF THE PREFERRED EMBODIMENT

Figure 2B:
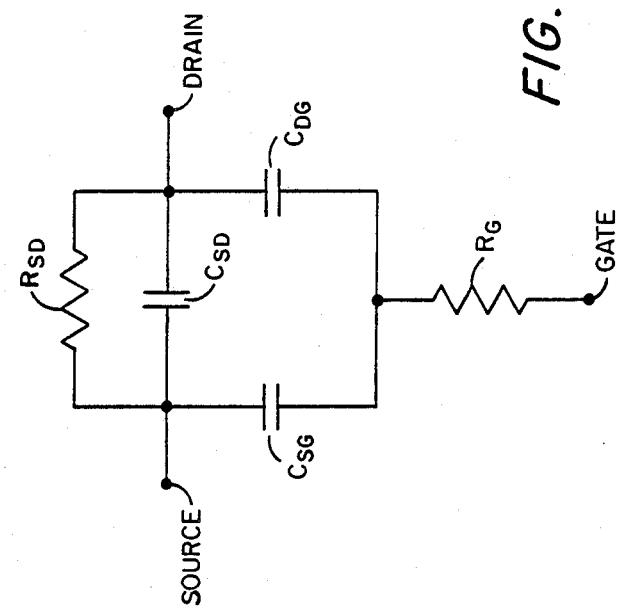
FIGS. 2A and 2B are equivalent drawings showing the "ON" and "OFF" impedances of a type of field effect transistor (FET) used in circuit illustrated in FIG. 1.
Figure 2A:
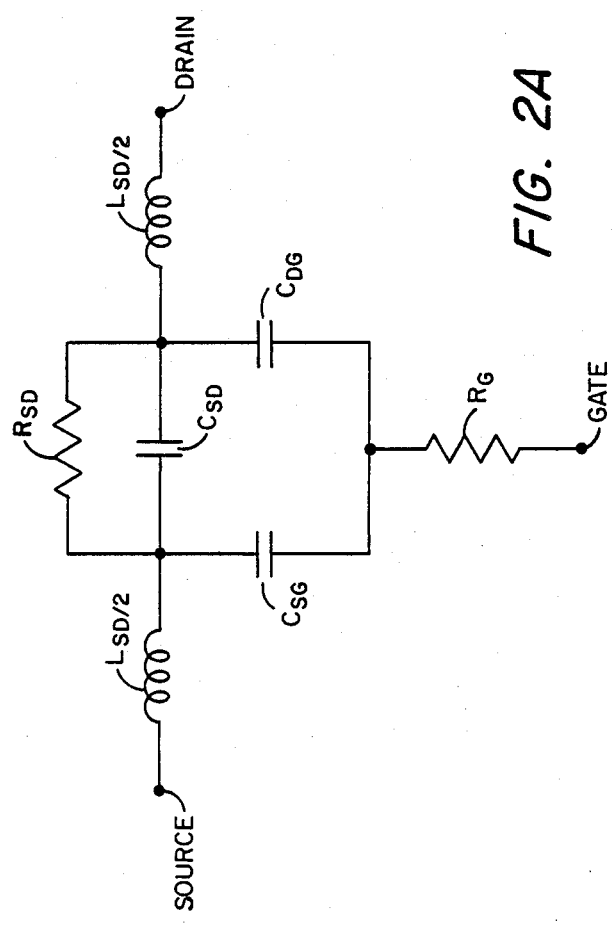

Before referring to the drawings in detail it should be noted that a balanced pi switching arrangement is here defined as a switching arrangement in which field effect transistors (FETS) are connected in a configuration corresponding to back-to-back lower case Greek letters "pi." That is to say, first FETs (referred to as the series FETs) are connected between corresponding end terminals of center-tapped input and output transformers and second and third FETs (referred to as the shunt FETs) are connected across each one of such transformers. In such a configuration high frequency signals applied to the input transformer are coupled to the output transformer when the series FETs are conductive and the shunt FETs are nonconductive. Conversely, when the series FETS are nonconductive and the shunt FETs are conductive, an open circuit effectively exists between the input and output transformers. It will be recognized, however, that, as shown in FIGS. 2A and 2B, the impedance between the source and drain electrodes of the series FETS is something greater than zero when such FETS are conducting and something less than infinity when such FETS are nonconducting. Further, it will be noted that differences in the various inter-electrode capacitances exist when the state of the FETS changes. As will now become clear, advantage here is taken of "state-dependency" of the FETS to permit circuit impedances to be optimized so that both isolation and bandwidth may be maximized.

Figure 1:
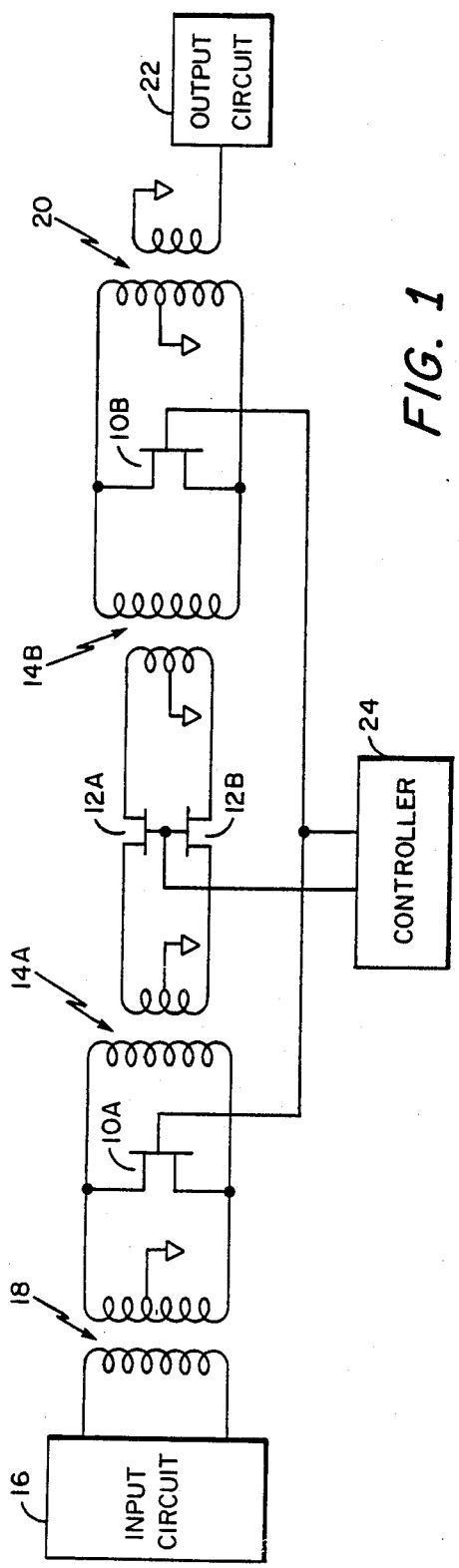
FIG. 1 is a simplified schematic diagram illustrating a balanced pi switching arrangement according to this invention.

Referring now to FIG. 1, it may be seen that the shunt FETs (FETs 10A, 10B) and the series FETs (FETs 12A, 12B) of a balanced pi switching arrangement are disposed so that the impedance seen by FETs 10A, 10B differ from the impedance seen by FETs 12A, 12B. Thus, isolating transformers 14A, 14B are placed as shown between the FETs 10A, 10B and FETs 12A, 12B. Insofar as the switching function is concerned, however, the disclosed circuit operates in a manner similar to a conventional balanced pi switching arrangement.

A high frequency signal is impressed on the illustrated circuitry through an input circuit 16 and an input transformer 18. The center of the secondary winding (not numbered) of the input transformer 18 is grounded while the ends of such secondary windings are connected to the ends of the primary winding (not numbered) of the isolating transformer 14A. The center of such primary winding (and the center of the secondary winding, not numbered) of isolating transformer 14A are grounded. A shunt FET, here FET 10A, is connected as shown across the secondar winding of the input transformer 18.

FETs 12A, 12B are connected as shown between the ends of the isolating transformers 14A, 14B. The ends of the secondary winding (not numbered) of the isolating transformer 14B in turn are connected to the primary winding (not numbered) of an output transformer 20. The centers of the primary and secondary windings of the isolating transformer 14B and the center of the primary winding (not numbered) of the output transformer 20 are grounded, as shown. The secondary winding of the output transformer 20 is connected to an output circuit 22. To complete the circuit a controller 24 is arranged to apply control signals to the FETs 10A, 10B, 12A, 12B. The controller 24, input circuit 16 and the output circuit 22 are not essential to an understanding of this invention.

It will be appreciated that the control signals applied to the FETs 10A, 10B are opposite to the control signals applied to the FETs 12A, 12B. That is to say, when FETs 10A, 10B are rendered conducting, FETs 12A, 12B are rendered nonconducting and vice versa. It will also be appreciated that the impedance seen by FETS 10A, 10B differs from the impedance seen by FETs 12A, 12B. Finally, it will be appreciated that the balanced configuration of the FETs 10A, 10B, 12A, 12B is effective to cancel the effect of inter-electrode capacitances (except for the source/drain capacitances of FETs 12A, 12B when those FETs are nonconducting). Thus, even though a single-ended signal source is connected to the input transformer and the output circuit is also single-ended, the effects of stray capacitances is reduced to a minimum.

The equivalent circuit shown in FIG. 2A is indicative of the interelectrode parameter of a type 2N4856 FET when conducting and the equivalent circuit shown in FIG. 2B is indicative of the interelectrode parameters of a type 2N4856 FET when nonconducting. The letter "L" represents inductance, the letter "C" represents capacitance and the letter "R" represents resistance, while the subscripts represent the various electrodes. The particular values of the parameters of interest here are shown in TABLE I.

TABLE I

| FIG. 2A | FIG. 2B | FIG. 2A | FIG. 2B | FIG. 2A | FIG. 2B |
| --- | --- | --- | --- | --- | --- |
| $C_{SD}$ = .006 pf | $C_{SD}$ = .02 pf | $C_{SG}$ = 9.7 pf | $C_{SG}$ = 3.26 pf | $C_{DG}$ = 10.8 pf | $C_{DG}$ = 3.46 pf |
| $R_{SD}$ = 17.8Ω | $R_{SD}$ = 1 MΩ | | | | |

Figure 3:
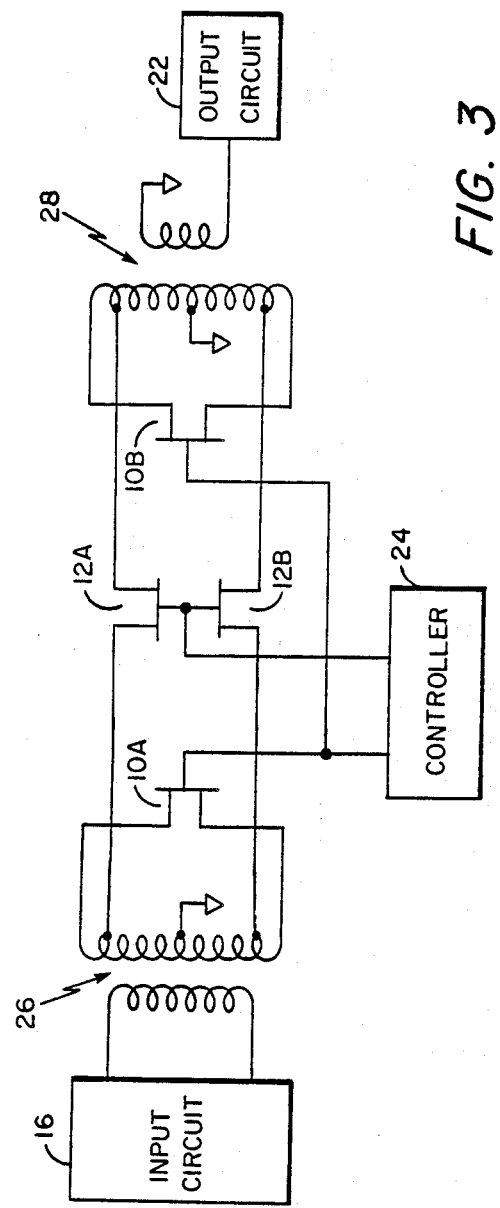
FIG. 3 is an alternative embodiment of the invention shown in FIG. 1.

An alternative embodiment of the invention is shown in FIG. 3 to have the input transformer 18 and the isolating transformer 14A, along with the output transformer 20 and the isolating transformer 14B of FIG. 1, combined. Thus, a combined input/isolating transformer 26 is shown to have a primary winding (not numbered) similar to the primary winding of the input transformer 18 (FIG. 1). However, the secondary winding (not numbered) of the input/isolating transformer 26 is tapped as shown in the manner of an autotransformer. The FET 10A is connected across the ends of the secondary winding (not numbered) of the input-/isolating transformer 26. The FETs 12A, 12B are connected, as shown, to the taps (not numbered). Similarly, an output/isolating transformer 28 is disposed as shown to provide connections for the FET 10B and the FETs 12A, 12B. It will be appreciated that the embodiment shown in FIG. 3 operates in a manner similar to the manner in which the embodiment shown in FIG. 1 operates.

Having described practical embodiments of this invention, it will now be apparent to one of skill in the art that changes may be made without departing from my inventive concepts. For example, the type of FET may be changed so long as the "ON" and "OFF" parameters differ. It is felt, therefore, that this invention should not be restricted to the disclosed embodiments, but rather should be limited only by the spirit and scope of the appended claims.

What is claimed is:

1. In an electronic switching arrangement wherein FETs are effectively disposed in a balanced pi configuration to pass, or to inhibit from passing, a radio frequency signal in accordance with the state of control signals applied to such FETs, the electronic switching arrangement including an input transformer to convert the radio frequency signal from a single-ended to a balanced signal and an output transformer to reconvert from a balanced signal to a single-ended signal, the improvement comprising:
    (a) a first isolating transformer connected to the input transformer;
    (b) a second isolating transformer connected to the output transformer;
    (c) a first and a second FET, each serially connected between the secondary winding of the first and the primary winding of the second isolating transformer;
    (d) a third and a fourth FET, one connected across the primary winding of the first isolating transformer and the other connected across the secondary winding of the second isolating transformer; and
    (e) means for producing control signals for each one of the FETs, the control signals being effective to turn "ON" the first and the second FETs and to turn "OFF" the third and the fourth FETs when the radio frequency signal is to pass and to turn "OFF" the first and the second FETs and to turn "ON" the third and the fourth FETs when the radio frequency signal is to be inhibited from passing.

2. The improvement as in claim 1 wherein the impedance seen by each one of the first and the second FETs is substantially equal to that seen by the other, the impedance seen by each one of the third and the fourth FETs is substantially equal to that seen by the other and greater than the impedance seen by each one of the first and the second FETs when conducting.

3. The improvement as in claim 2 wherein each one of the first, second, third and fourth FETs is selected from FETs of the same type.

4. An electronic switching arrangement comprising:
(a) a first transformer having a single-ended primary winding and a center-tapped secondary winding, with an additional balanced set of taps and end terminals;
(b) a second transformer having a single-ended secondary winding and a primary winding similar to the secondary winding of the first transformer;
(c) a first pair of FETs, one being connected across the end terminals of the secondary winding of the first transformer and the other being connected across the end terminals of the primary winding of the second transformer;
(d) a second pair of FETs, one being connected between a selected tap on the windings of each one of the transformers and the other being connected between the remaining taps; and
(e) means for selectively controlling the conductivity of the first and the second pair of FETs.

* * * * *